United States Patent
Chang et al.

(10) Patent No.: US 11,785,766 B2
(45) Date of Patent: Oct. 10, 2023

(54) E-FUSE

(71) Applicant: Taiwan Semiconductor Manufacturing Company, Ltd., Hsinchu (TW)

(72) Inventors: Meng-Sheng Chang, Hsinchu (TW); Yao-Jen Yang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 92 days.

(21) Appl. No.: 17/175,822

(22) Filed: Feb. 15, 2021

(65) Prior Publication Data

US 2021/0193670 A1  Jun. 24, 2021

Related U.S. Application Data

(63) Continuation of application No. 16/365,091, filed on Mar. 26, 2019, now Pat. No. 10,923,483.

(60) Provisional application No. 62/678,739, filed on May 31, 2018.

(51) Int. Cl.
   *H10B 20/20* (2023.01)
   *H01L 23/525* (2006.01)
(52) U.S. Cl.
   CPC ......... *H10B 20/20* (2023.02); *H01L 23/5252* (2013.01)

(58) Field of Classification Search
   CPC combination set(s) only.
   See application file for complete search history.

(56) References Cited

U.S. PATENT DOCUMENTS

| | | | |
|---|---|---|---|
| 8,299,567 B2 | 10/2012 | Wang et al. | |
| 10,062,446 B2 | 8/2018 | Huang | |
| 10,923,483 B2* | 2/2021 | Chang | H01L 27/11206 |
| 2007/0018280 A1 | 1/2007 | Motsiff et al. | |
| 2009/0141578 A1* | 6/2009 | Bang | G11C 29/785 |
| | | | 257/E23.149 |
| 2014/0001568 A1 | 1/2014 | Wang et al. | |
| 2014/0332923 A1* | 11/2014 | Filippi | H01L 23/5329 |
| | | | 438/467 |
| 2016/0300843 A1* | 10/2016 | Jung | H01L 27/11206 |
| 2017/0005036 A1* | 1/2017 | Kodama | H01L 21/02502 |
| 2017/0069570 A1* | 3/2017 | Yoon | H01L 27/11582 |
| 2017/0186495 A1* | 6/2017 | Yang | G11C 17/16 |
| 2018/0053767 A1 | 2/2018 | Cheng et al. | |
| 2018/0301411 A1* | 10/2018 | Kim | H01L 23/5256 |
| 2019/0362924 A1* | 11/2019 | Zhou | H01H 85/165 |

FOREIGN PATENT DOCUMENTS

| | | |
|---|---|---|
| CN | 106981300 A | 7/2017 |
| KR | 10-2013-0112886 A | 10/2013 |
| KR | 10-2015-0033690 A | 4/2015 |

* cited by examiner

*Primary Examiner* — Ratisha Mehta
(74) *Attorney, Agent, or Firm* — Merchant & Gould P.C.

(57) ABSTRACT

A metal fuse structure may be provided. The metal fuse structure may comprise a first fuse element and a second fuse element. The second fuse element may be adjacent to the first fuse element for a length L. The second fuse element may be spaced apart from first fuse element by a width W.

20 Claims, 7 Drawing Sheets

E-FUSE

CROSS-REFERENCE TO RELATED APPLICATIONS

This application is a continuation of application Ser. No. 16/365,091, filed Mar. 26, 2019, now issued as U.S. Pat. No. 10,923,483 on Feb. 16, 2021, entitled "EFUSE", which application claims the benefit of U.S. Provisional Application No. 62/678,739, filed on May 31, 2018, entitled "EFUSE". The aforementioned applications are incorporated herein by reference in their entirety.

BACKGROUND

Many integrated circuits (ICs) are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as complementary Metal-Oxide-Semiconductor (CMOS) memory, antifuse memory, and E-fuse memory.

One-Time-Programmable (OTP) memory elements are used in ICs to provide Non-Volatile Memory (NVM). Data in NVM is not lost when the IC is turned off. NVM allows an IC manufacturer to store a lot number and security data on the IC, for example, and is useful in many other applications. One type of NVM utilizes an electrical fuse (eFuse).

EFuses are usually integrated into semiconductor ICs by using a narrow strip commonly called a "fuse link" of conducting material (e.g., metal, poly-silicon, etc.) between two pads, generally referred to as anode and cathode. Applying a programing current to the eFuse destroys (i.e., fuses) the link, thus changing the resistivity of the eFuse. This is referred to as "programming" the eFuse. The fuse state (i.e., whether it has been programmed) can be read using a sensing circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods as described herein provide a non-volatile memory having a delta metal fuse (i.e., a dfuse). A non-volatile memory, such as a Read-Only Memory (ROM), may include a plurality of memory cells, each of which may include a transistor connected to a word line and a dfuse connected to a bit line. When programming a "1", the dfuse may be blown by applying write voltages to the word and bit lines (e.g., to breakdown a dielectric comprising, for example, oxide between elements of the dfuse thus blowing the dfuse).

A ROM may include a substrate, a first conductive (e.g., metal) layer (M0) above the substrate, a second conductive (e.g., metal) layer (M1) above M0, and a third conductive (e.g., metal) layer (M2) above M1. Other metal layers (e.g., M3, M4, . . . M12) may also be included. The dfuses of the memory cell may be disposed in M0 or M2. The transistors of the memory cell may be disposed in the same semiconductor layer under M0.

Embodiments of the disclosure may include metal fuse elements of the dfuse that may be in the same metal layer, arranged in parallel with an overlap and offset as described in greater detail below. This arrangement may provide for a reduced fuse area, for example, in the ROM that may use dfuses consistent with embodiments of the disclosure. For example, in an eight-by-eight cell array using dfuses consistent with embodiments of the disclosure, the area used by the eight-by-eight cell array may comprise 12.83 $\mu m^2$ (e.g., 3.915 $\mu m \times 3.276$ $\mu m$). A similar array using conventional fuses may comprise 238.9 $\mu m^2$ (e.g., 17.4 $\mu m \times 13.728$ $\mu m$).

Accordingly, embodiments of the disclosure may provide a reduction in area of almost 95% for example.

The aforementioned arrangement of the metal fuse elements of the dfuse consistent with embodiments of the disclosure may also provide for a lower programing current (i.e., to blow the dfuse) as compared to conventional fuses. For example, the programing current for the dfuse consistent with embodiments of the disclosure may be less than 1 µA. The programing current for conventional fuses may be about 10 mA. Furthermore, the aforementioned lower programing current provided by embodiments of the disclosure may, in turn, allow for a smaller transistor size (minimum gate length) as compared to those used in conventional non-volatile memory cells.

Figure 1:
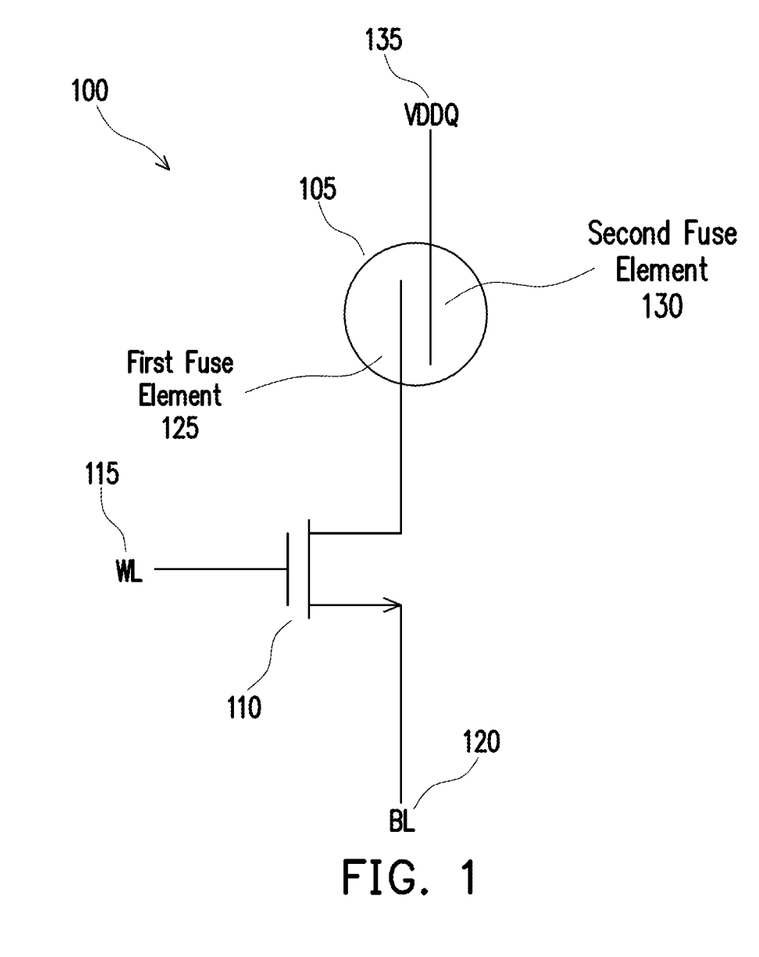
FIG. 1 is a block diagram that may illustrate a non-volatile memory cell in accordance with some embodiments.

FIG. 1 is a block diagram illustrating a non-volatile memory cell 100 in accordance with some embodiments of the disclosure. As shown in FIG. 1, the non-volatile memory cell 100 includes a fuse 105 (e.g., a dfuse), a transistor 110, a Word Line (WL) 115, and a Bit Line (BL) 120. The fuse 105 may comprise a first fuse element 125 and a second fuse element 130. Within the non-volatile memory cell 100, the first fuse element 125 may be connected to the transistor 110 and the second fuse element 130 may be connected to VDDQ.

The transistor 110 may comprise a metal-oxide-semiconductor field-effect transistor (MOSFET). As a MOSFET, consistent with embodiments of the disclosure, the transistor may utilize an N-type metal-oxide-semiconductor (NMOS) or the transistor may utilize a P-type metal-oxide-semiconductor (PMOS) for example. The transistor 110 may be disposed below a metal zero (M0) layer of an integrated circuit that may comprise the non-volatile memory cell 100.

Figure 2A:
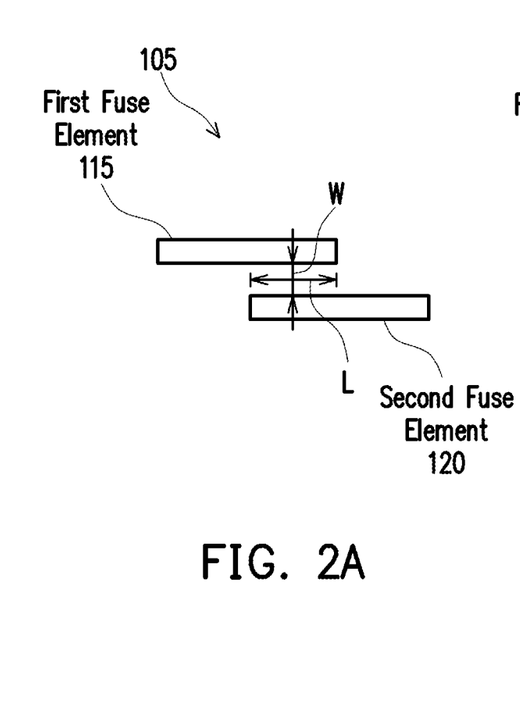
FIG. 2A illustrates a fuse in accordance with some embodiments.

FIG. 2A illustrates an example of the fuse 105 in accordance with some embodiments of the disclosure. As shown in FIG. 2A, the second fuse element 120 is adjacent to the first fuse element 115 for a length L. Furthermore, the second fuse element 120 is spaced apart from the first fuse element 115 by a width W in the illustrate example. The fuse 105 may be fabricated on an IC metal layer. For example, the fuse 105 may be fabricated on the M0 layer or M2 layer. Because the M0 layer may have a smaller minimum thickness (e.g., 0.018 µm) as compared to other layers (e.g., that may have a thickness of 0.02 µm), the fuse 105 may be blown with a lower programing current due to the smaller thickness. The first fuse element 115 and the second fuse element 120 may be fabricated on the same IC layer.

Consistent with embodiments of the disclosure, the first fuse element 115 and the second fuse element 120 may be made from an electrically conductive material. The electrically conductive material may comprise a metal such as copper for example. Furthermore, the electrically conductive material may comprise silicide, metal, or a combination of silicide and metal for example. Consistent with embodiments of the disclosure, oxide may be disposed between first fuse element 115 and the second fuse element 120.

Figure 2B:
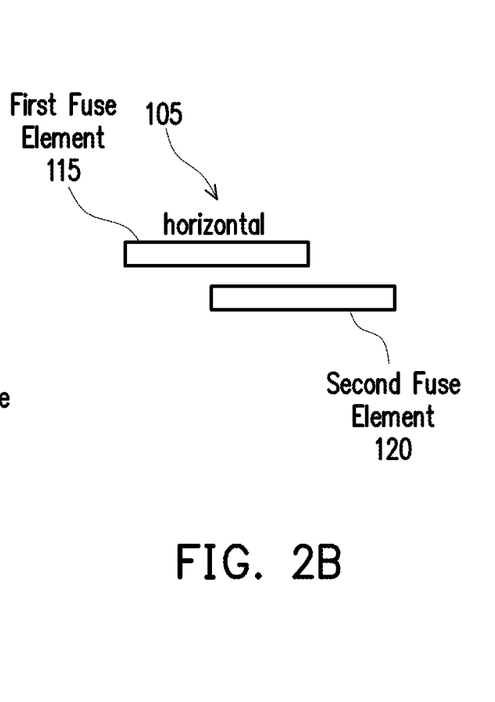
FIG. 2B illustrates a horizontal fuse in accordance with some embodiments.

FIG. 2B illustrates a horizontal fuse 105 in accordance with some embodiments of the disclosure. As shown in FIG. 2B, The first fuse element 115 and the second fuse element 120 may be fabricated to have a horizontal orientation.

Figure 2C:
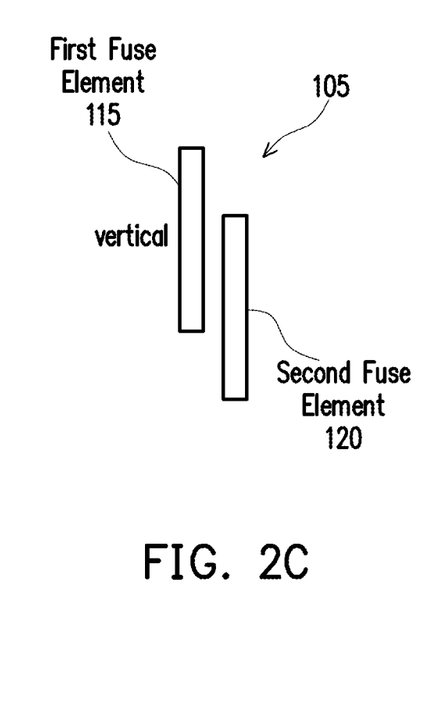
FIG. 2C illustrates a vertical fuse in accordance with some embodiments.

FIG. 2C illustrates a vertical fuse 105 in accordance with some embodiments of the disclosure. As shown in FIG. 2C, the first fuse element 115 and the second fuse element 120 may be fabricated to have a vertical orientation.

Figure 3A:
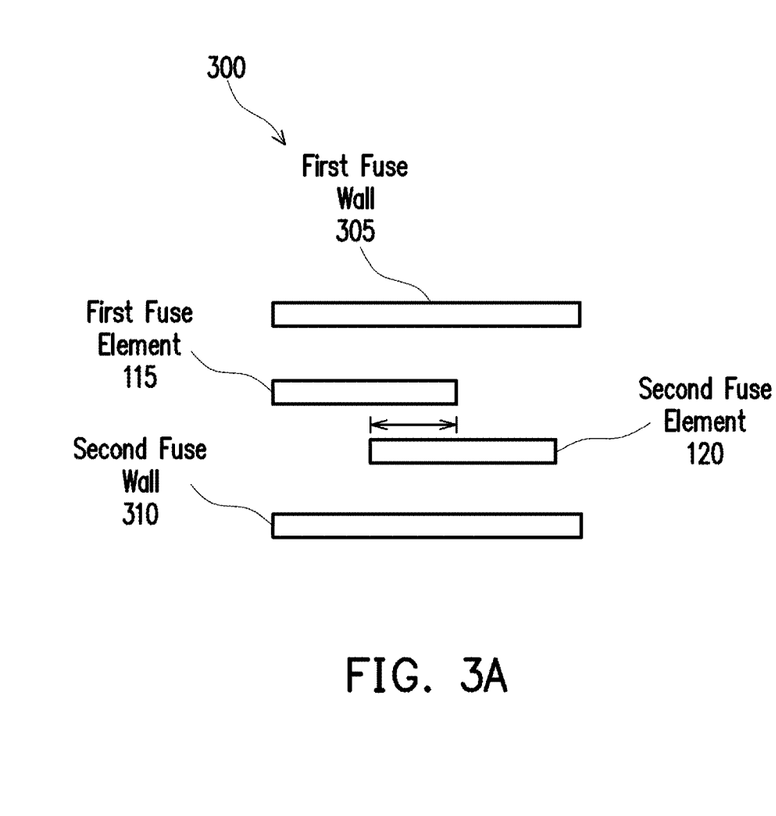
FIG. 3A illustrates a fuse cell with fuse walls in accordance with some embodiments.

FIG. 3A illustrates a single fuse cell 300 with fuse walls in accordance with some embodiments of the disclosure. As shown in FIG. 3A, the first fuse element 115 and the second fuse element 120 may be disposed between a first fuse wall 305 and a second fuse wall 310. When programming the non-volatile memory cell 100 (i.e., blowing fuse 105), some residue (e.g., metal or oxide) may spray or "sputter" during the fuse blowing process. Accordingly, the first fuse wall 305 and the second fuse wall 310 may be used to contain this residue and to keep it from contaminating other areas. The first fuse wall 305 and the second fuse wall 310 may be made from the same material as the first fuse element 115 and the second fuse element 120 for example.

Figure 3B:
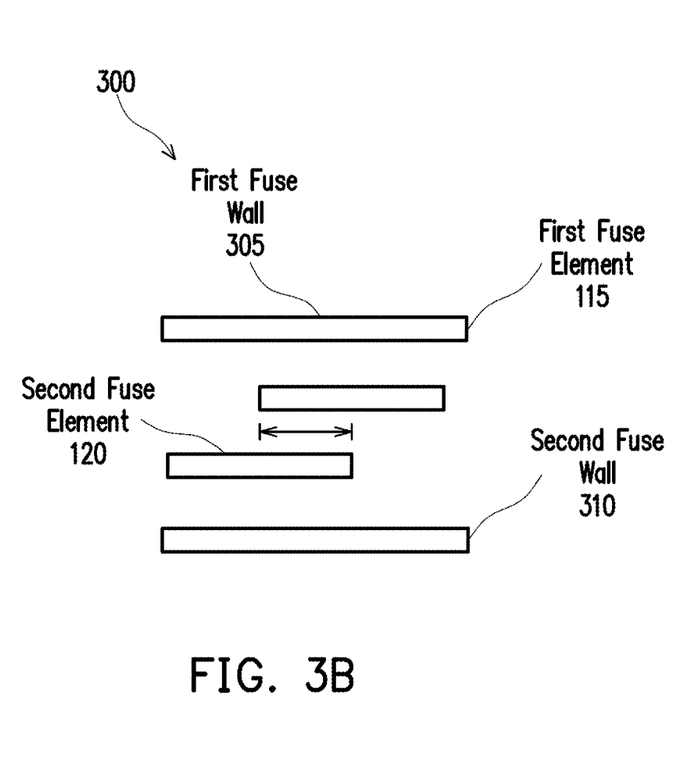
FIG. 3B illustrates a fuse cell with fuse walls in accordance with some embodiments.

FIG. 3B illustrates the single fuse cell 300 with fuse walls in accordance with some embodiments of the disclosure. Like FIG. 3A, as shown in FIG. 3B, the first fuse element 115 and the second fuse element 120 may be disposed between a first fuse wall 305 and a second fuse wall 310. However, as compared to FIG. 3A, the embodiment disclosed in FIG. 3B shows the second fuse element 120 being the leftmost fuse element as compared to the first fuse element 115, which may be the rightmost fuse element. The embodiment of FIG. 3A shows the first fuse element 115 being the leftmost fuse element as compared to the second fuse element 120, which may be the rightmost fuse element. As described above with respect to FIG. 3A, the first fuse wall 305 and the second fuse wall 310 may be used to contain residue during the fuse blowing process and to keep residue from contaminating other areas.

Figure 4:
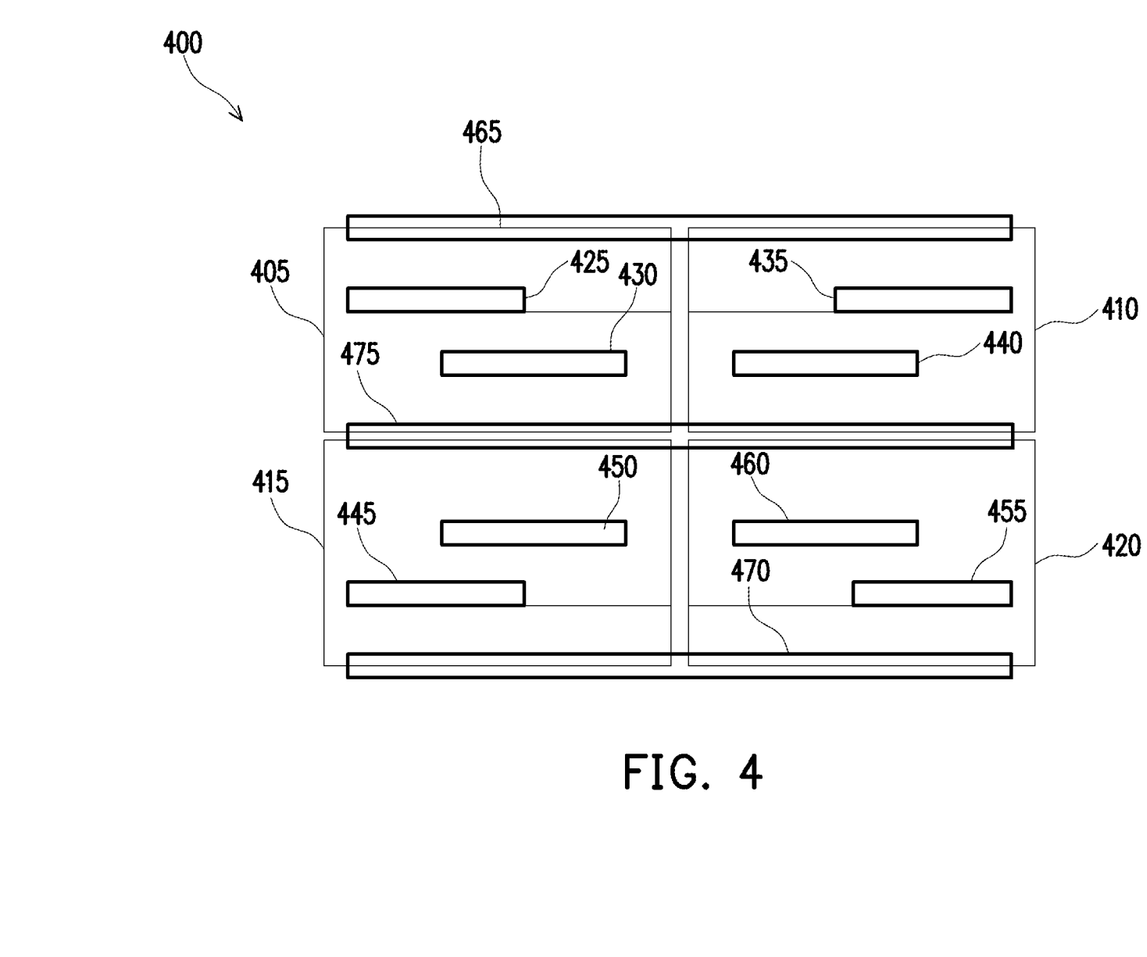
FIG. 4 illustrates the layout of a group of fuse cells in a four-by-four fuse cell array in accordance with some embodiments.

FIG. 4 illustrates a layout of a group of fuse cells in a four-by-four fuse cell array 400 in accordance with some embodiments. As shown in FIG. 4, the four-by-four fuse cell array 400 may comprise a group of four fuse cells respectively arranged in a first quadrant 405, a second quadrant 410, a third quadrant 415, and a fourth quadrant 420. For example, each of the four fuse cells in the four-by-four fuse cell array 400 has a first fuse element and a second fuse element as described above. For example, the first quadrant 405 may comprise a first quadrant first fuse element 425 and a first quadrant second fuse element 430. In addition, the second quadrant 410 may comprise a second quadrant first fuse element 435 and a second quadrant second fuse element 440. The third quadrant 415 may comprise a third quadrant first fuse element 445 and a third quadrant second fuse element 450. Moreover, the fourth quadrant 420 may comprise a fourth quadrant first fuse element 455 and a fourth quadrant second fuse element 460. Similar to that described above with respect to FIG. 2A, the first fuse elements and the second fuse elements described in FIG. 4 may be adjacent to each other for a length and may be spaced apart from each other by a width W.

Embodiments of the disclosure may also comprise a plurality of fuse walls. For example, as shown in FIG. 4, four-by-four fuse cell array 400 may be disposed between first fuse wall 465 and a second fuse wall 470 of the plurality of fuse walls. Furthermore, a third fuse wall 475 of the plurality of fuse walls may separate first quadrant 405 and the second quadrant 410 from third quadrant 415 and fourth quadrant 420. Similar to that described above, the plurality of fuse walls (i.e., first fuse wall 305, second fuse wall 310, and third fuse wall 475) may be used to contain residue during the fuse blowing process and to keep residue from contaminating other areas.

Figure 5:
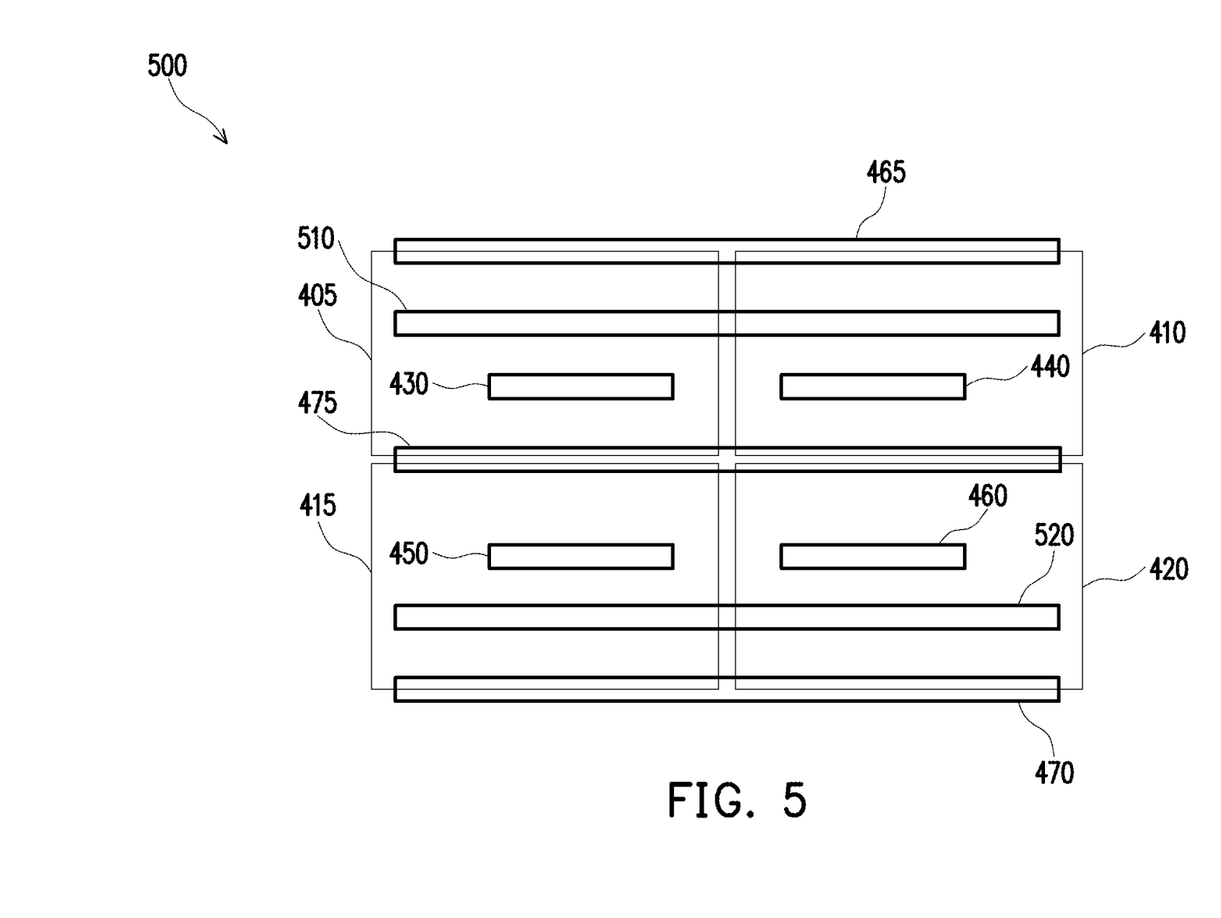
FIG. 5 illustrates the layout of a group of fuse cells in a four-by-four fuse cell array in accordance with some embodiments.

FIG. 5 illustrates a layout of a four-by-four fuse cell array 500 in accordance with some embodiments of the disclosure. As shown in FIG. 5, the first quadrant first fuse element 425 and the second quadrant first fuse element 435 (i.e., of FIG. 4) may be connected (e.g., as an upper fuse element 510) across the first quadrant 405 and the second quadrant 410. Similarly, the third quadrant first fuse element 445 and the fourth quadrant first fuse element 455 (i.e., of FIG. 4)

may be connected (e.g., as lower fuse element 520) across the third quadrant 415 and the fourth quadrant 420. Accordingly, the upper fuse element 510 may comprise a first fuse element shared between the fuse cells of the first quadrant 405 and the second quadrant 410. Similarly, the lower fuse element 520 has a first fuse element that may be shared between the fuse cells of the third quadrant 415 and the fourth quadrant 420.

Figure 6:
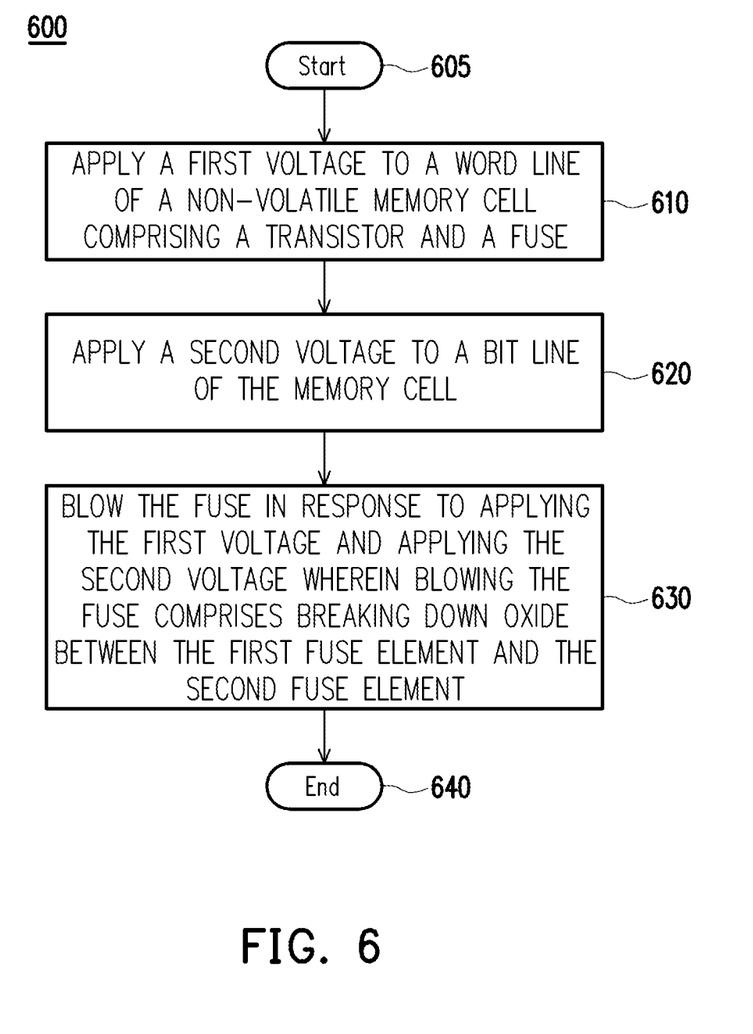
FIG. 6 is a flow chart of a method for programming a memory cell comprising a metal fuse structure in accordance with some embodiments.

FIG. 6 is a flow chart setting forth the general operations involved in a method 600 consistent with an embodiment of the disclosure for programming the non-volatile memory cell 100 comprising a metal fuse structure. Ways to implement the operations of method 600 will be described in greater detail below.

The illustrated method 600 begins at a starting block 605 and proceeds to an operation 610 where a first voltage is applied to the word line 115 of the non-volatile memory cell 100 comprising the transistor 110 and the fuse 105. For example, the first voltage may be the turn on voltage for transistor 110, which may comprise, for example, 1.8V.

From the operation 610, where the first voltage is applied to the word line 115 of the non-volatile memory cell 100 comprising the transistor 110 and the fuse 105, the illustrated method 600 advances to an operation 620 where a second voltage is applied to the bit line 120 of the non-volatile memory cell 100. For example, the second voltage may comprise VDDQ which may be, for example, a value between 1.8V and 5V.

Once the second voltage is applied to the bit line 120 of the non-volatile memory cell 100 in the operation 620, the method 600 may continue to an operation 630 where the fuse 105 is blown in response to applying the first voltage and applying the second voltage. Consistent with embodiments of the disclosure, blowing the fuse 105 includes breaking down oxide between the first fuse element 125 and the second fuse element 130. For example, the fuse elements of the fuse 105 may be in the same metal layer, arranged in parallel with an overlap and offset. This arrangement of the fuse elements of the fuse 105 consistent with embodiments of the disclosure may also provide for a lower programing current (i.e., to blow the dfuse) as compared to conventional fuses. For example, the programing current for the fuse 105 consistent with embodiments of the disclosure may be less than 1 µA. Once the fuse 105 is blown in response to applying the first voltage and applying the second voltage in the operation 630, the method 600 may then end at operation 640.

Figure 7:
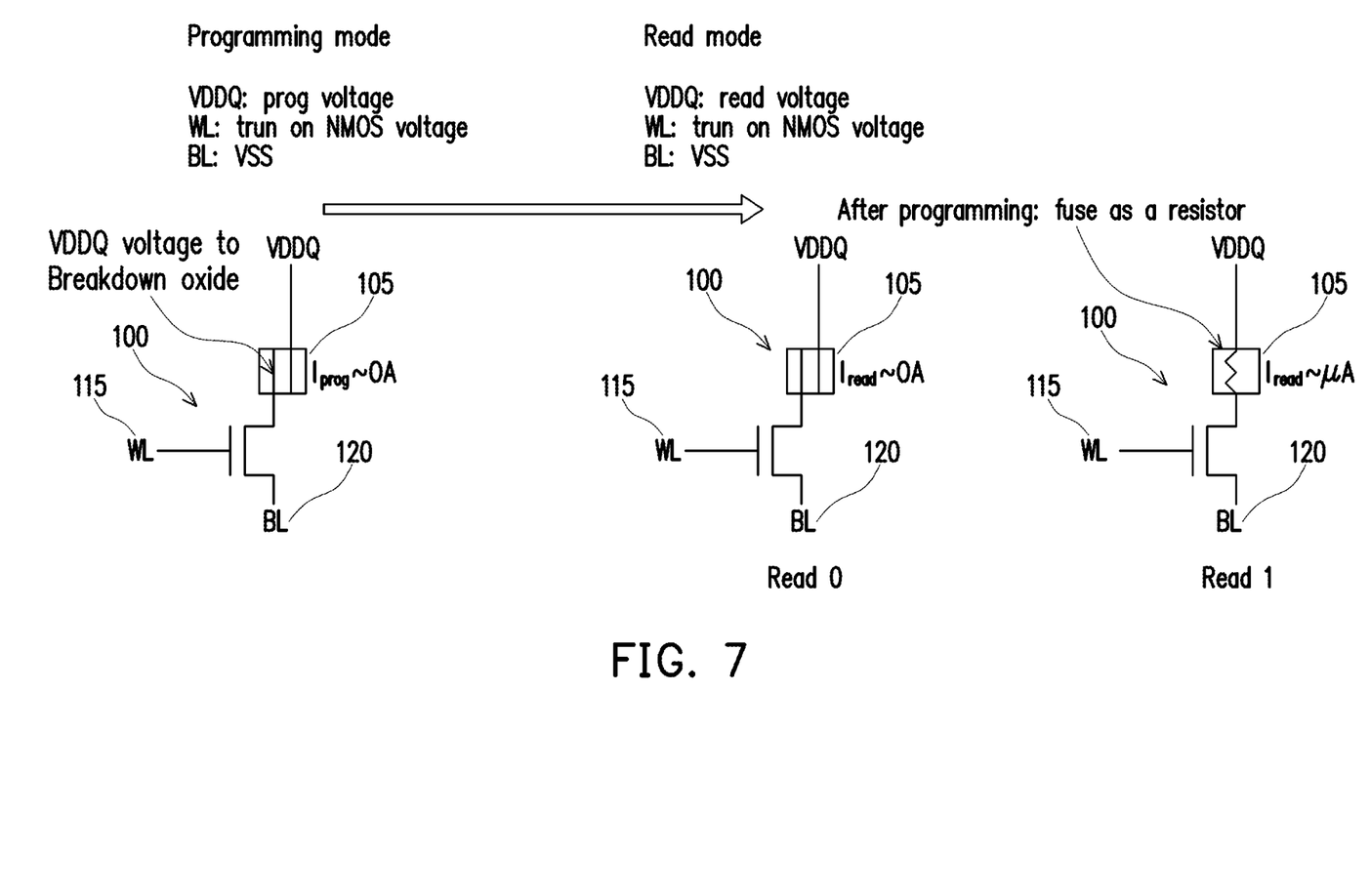
FIG. 7 illustrates programing and reading a non-volatile memory cell in accordance with some embodiments in accordance with some embodiments.

FIG. 7 illustrates an example of programming and reading the non-volatile memory cell 100 in accordance with some embodiments of the disclosure. In a programming mode, the non-volatile memory cell 100 may be programing according to the process described above with respect to FIG. 6 discussed above. In a read mode, the word line 115 may be used to turn on the transistor 110. If the fuse 105 has not been blown, the non-volatile memory cell 100 reads a "0" (i.e., Iread is approximately 0). If the fuse 105 has been blown, it may function as a resistor and the non-volatile memory cell 100 reads a "1" (i.e., Iread is approximately 1 µA).

Embodiments of the disclosure may include metal fuse elements of a dfuse that may be in the same metal layer, arranged in parallel with an overlap and offset. This arrangement may provide for a reduced fuse area, for example, in a ROM that may use dfuses consistent with embodiments of the disclosure. Embodiments of the disclosure may provide a reduction in area of almost 95% for example. The aforementioned arrangement of the metal fuse elements of the dfuse consistent with embodiments of the disclosure may also provide for a lower programing current (i.e., to blow the dfuse) as compared to conventional fuses. The lower programing current provided by embodiments of the disclosure may, in turn, allow for a smaller transistor size (i.e., minimum gate length) as compared to those used in conventional non-volatile memory cells.

An embodiment of the disclosure may comprise a fuse. The fuse may comprise a first fuse element and a second fuse element. The second fuse element may be adjacent to the first fuse element for a length L. The second fuse element may be spaced apart from first fuse element by a width W.

Another embodiment of the disclosure may comprise a group of four fuse cells respectively arranged in a first quadrant, a second quadrant, a third quadrant, and a fourth quadrant. Each of the four fuse cells may comprise a first fuse element and a second fuse element. The second fuse element may be adjacent to the first fuse element for a length L and the second fuse element may be spaced apart from first fuse element by a width W. The group of four fuse cells may further comprise a plurality of fuse walls. The group of four fuse cells may be disposed between a first fuse wall and a second fuse wall of the plurality of fuse walls. A third fuse wall of the plurality of fuse walls may separate the first quadrant and the second quadrant from the third quadrant and the fourth quadrant.

Yet another embodiment of the disclosure may comprise a method for programming a non-volatile memory cell comprising a metal fuse structure. Embodiments of the disclosure may comprise applying a first voltage to a word line of a non-volatile memory cell comprising a transistor and a fuse, applying a second voltage to a bit line of the memory cell, and blowing the fuse in response to applying the first voltage and applying the second voltage. Blowing the fuse may comprise breaking down oxide between a first fuse element and a second fuse element. The second fuse element may be adjacent to the first fuse element for a length L and the second fuse element may be spaced apart from first fuse element by a width W.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
  a first fuse element;
  a second fuse element spaced apart from first fuse element; and
  a dielectric fuse medium disposed between the first and second fuse elements and adapted to change from a first conductive state to a second conductive state when a current greater than a threshold level flows from the first fuse element to the second fuse element through the dielectric fuse medium.

2. The apparatus of claim 1, wherein the fuse medium has a higher resistance in the first conductive state than in the second conductive state.

3. The apparatus of claim 2, wherein the first and second fuse elements are made of an electrically conductive material.

4. The apparatus of claim 3, wherein the electrically conductive material comprises one of the following: silicide, metal, and a combination of silicide and metal.

5. The apparatus of claim 1, wherein the dielectric fuse medium comprises an oxide.

6. The apparatus of claim 1, wherein the first fuse element and the second fuse element are arranged in a horizontal orientation relative to a fuse wall.

7. The apparatus of claim 1, wherein the first fuse element and the second fuse element are arranged in a vertical orientation relative to a fuse wall.

8. The apparatus of claim 1, wherein the first fuse element and the second fuse element are disposed in a metal zero (M0) layer of an integrated circuit.

9. The apparatus of claim 1, wherein the first fuse element and the second fuse element are disposed in a metal two (M2) layer of an integrated circuit.

10. The apparatus of claim 1, wherein the first fuse element and the second fuse element are disposed between a first fuse wall and a second fuse wall.

11. The apparatus of claim 1, wherein the first fuse element and the second fuse element are disposed in a non-volatile memory cell.

12. The apparatus of claim 1, wherein the first fuse element is connected to a connected to a transistor comprising a metal-oxide-semiconductor field-effect transistor (MOSFET).

13. The apparatus of claim 12, wherein the transistor is disposed below a metal zero (M0) layer of an integrated circuit.

14. The apparatus of claim 12, wherein the transistor is an N-type metal-oxide-semiconductor (NMOS).

15. The apparatus of claim 12, wherein the transistor is a P-type metal-oxide-semiconductor (PMOS).

16. The apparatus of claim 1, wherein the second fuse element is connected to a VDDQ.

17. An apparatus comprising:
   a group of four fuse cells respectively arranged in a first quadrant, a second quadrant, a third quadrant, and a fourth quadrant, each of the four fuse cells comprising;
      a first fuse element,
      a second fuse element,
      a dielectric fuse medium disposed between the first and second fuse elements and adapted to change from a first conductive state to a second conductive state after a current greater than a threshold level flows through the portion; and
   a plurality of fuse walls wherein the group of four fuse cells are disposed between a first fuse wall and a second fuse wall of the plurality of fuse walls and wherein a third fuse wall of the plurality of fuse walls separates the first quadrant and the second quadrant from the third quadrant and the fourth quadrant.

18. The apparatus of claim 17, wherein the first fuse element of the first quadrant and the first fuse element of the second quadrant are connected across the first quadrant and the second quadrant and wherein the first fuse element of the third quadrant and the first fuse element of the fourth quadrant are connected across the third quadrant and the fourth quadrant.

19. A computing method comprising:
   programming a non-volatile memory cell comprising:
      a transistor having a first and second terminals and a control terminal, and
      a fuse comprising:
         a first fuse element,
         a second fuse element spaced apart from first fuse element and connected to the first terminal of the transistor, and
         a dielectric fuse medium disposed between the first and second fuse elements;
   the programming comprising:
      applying a control voltage to the control terminal of the transistor to turn on the transistor, and
      applying a sufficient programming voltage between the first fuse element and second terminal of the transistor through a bit line ("BL") to cause a breakdown of the dielectric fuse medium in response to the turning on of the transistor and application of programming voltage.

20. The computing method of claim 19, further comprising reading a value stored in the non-volatile memory cell by determining a value of a current through the BL.

* * * * *